United States Patent
Xue et al.

(10) Patent No.: US 11,346,901 B2
(45) Date of Patent: May 31, 2022

(54) ANISOTROPIC MAGNETORESISTIVE (AMR) SENSOR WITHOUT SET AND RESET DEVICE

(71) Applicant: MultiDimension Technology Co., Ltd., Zhangjiagang (CN)

(72) Inventors: Songsheng Xue, Zhangjiagang (CN); Xiaofeng Lei, Zhangjiagang (CN); Weifeng Shen, Zhangjiagang (CN); Lixian Feng, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 40 days.

(21) Appl. No.: 16/091,930

(22) PCT Filed: Apr. 5, 2017

(86) PCT No.: PCT/CN2017/079493
§ 371 (c)(1),
(2) Date: Oct. 5, 2018

(87) PCT Pub. No.: WO2017/173992
PCT Pub. Date: Oct. 12, 2017

(65) Prior Publication Data
US 2019/0120916 A1 Apr. 25, 2019

(30) Foreign Application Priority Data
Apr. 6, 2016 (CN) .......................... 201620279414.7

(51) Int. Cl.
*G01R 33/09* (2006.01)
(52) U.S. Cl.
CPC ........... *G01R 33/096* (2013.01); *G01R 33/09* (2013.01)
(58) Field of Classification Search
CPC ................................................... G01R 33/096
See application file for complete search history.

(56) References Cited

U.S. PATENT DOCUMENTS 4,967,598 A * 11/1990 Wakatsuki .......... G01P 15/0802
73/514.12
6,100,686 A * 8/2000 Van Delden ........... B82Y 10/00
324/207.12
(Continued)

FOREIGN PATENT DOCUMENTS

CN 202494772 U 10/2012
CN 104567950 A 4/2015
(Continued)

OTHER PUBLICATIONS

"International Application No. PCT/CN2017/079493, International Search Report and Written Opinion dated Jun. 5, 2017", (Jun. 5, 2017), 10 pgs.
(Continued)

*Primary Examiner* — Walter L Lindsay, Jr.
*Assistant Examiner* — Milton Gonzalez
(74) *Attorney, Agent, or Firm* — Schwegman Lundberg & Woessner, P.A.

(57) ABSTRACT

An anisotropic magnetoresistive (AMR) sensor without a set and reset device may include a substrate, an exchange bias layer, an AMR layer and a collection of barber-pole electrodes. The exchange bias layer may be deposited on the substrate and the AMR layer may be deposited on the exchange bias layer. The AMR layer may include multiple groups of AMR strips, and each group may include several AMR strips. The barber-pole electrodes may be arranged on each AMR strip. The AMR sensor achieves coupling by using the exchange bias layer, without requiring a reset/set coil. Because a coil is not used, the power consumption of the chip is reduced greatly, and the manufacturing process is simpler, providing improved yield and lower cost.

8 Claims, 5 Drawing Sheets

(56) References Cited

U.S. PATENT DOCUMENTS

| 8,885,302 B1 | 11/2014 | David et al. |
| 2013/0300408 A1 | 11/2013 | Qiu et al. |
| 2013/0320972 A1 | 12/2013 | Loreit et al. |
| 2015/0061658 A1 | 3/2015 | Zimmer et al. |
| 2018/0067146 A1* | 3/2018 | Kawanami ........... G01R 15/205 |

FOREIGN PATENT DOCUMENTS

| CN | 104900801 A | 9/2015 | |
| CN | 105261699 A | 1/2016 | |
| CN | 205809273 U | 12/2016 | |
| CN | 205861754 U | 1/2017 | |
| DE | 3442278 A1 | 5/1986 | |
| DE | 4221385 A1 | 1/1994 | |
| WO | WO-2015182643 A1 * | 12/2015 | ............. H01F 10/32 |
| WO | WO-2017173992 A1 | 10/2017 | |

OTHER PUBLICATIONS

"European Application No. 17778656.3, Extended European Search Report dated Oct. 22, 2019", (Oct. 22, 2019), 7 pgs.

\* cited by examiner

ANISOTROPIC MAGNETORESISTIVE (AMR) SENSOR WITHOUT SET AND RESET DEVICE

PRIORITY CLAIM TO RELATED APPLICATIONS

This application is a U.S. national stage filing under 35 U.S.C. § 371 from International Application No. PCT/CN2017/079493, filed on 5 Apr. 2017, and published as WO2017/173992 on 12 Oct. 2017, which claims the benefit under 35 U.S.C. 119 to Chinese Application No. 201620279414.7, filed on 6 Apr. 2016, the benefit of priority of each of which is claimed herein, and which applications and publication are hereby incorporated herein by reference in their entirety.

TECHNICAL FIELD

The present subject matter relates to a magnetoresistive sensor configured to detect vector distribution of a magnetic including at least one type of anisotropic magnetoresistive device deposited on a substrate, the magnetoresistive device including a plurality of anisotropic magnetoresistive (AMR) elements connected in series through conductive bars. The magnetoresistive device adopts a barber-pole electrode structure to improve the sensitivity in a weak magnetic field and expand the linear operating range. Moreover, the exchange coupling characteristic of art anti-ferromagnetic layer is used and a reset and set device is cancelled, thereby further reducing the power consumption and the cost of the sensor.

BACKGROUND ART

An anisotropy magnetoresistance (AMR) effect refers to a phenomenon that the specific resistance in a ferromagnetic material changes as an included angle between a magnetization intensity of the ferromagnetic material and a current direction changes. The AMR effect is first discovered by Thomson in 1857. A sensor prepared by using the AMR effect is referred to as an ARM sensor.

Generally, a structure called Barber-pole electrode is adopted in the current AMR sensor design. Specifically, some metal conductive electrodes such as aluminum, copper, and gold are disposed on AMR strips, and the electrodes are arranged to form 45°-structures with long axes of the AMR strips. As shown in FIG. 1, a barber-pole electrode achieves the objective of changing the current direction by changing the structures of the electrodes, which is advantageous in a small volume and low power consumption compared with other methods, thereby being widely applied. The patent No. DE3442278A1 has descriptions about the barber-pole electrode.

The AMR sensor requires an additional magnetic field during use to bias the sensor, so as to improve the linearity and stability of the sensor and at the same time eliminate temperature drift and improve the signal-to-noise rate of the sensor. DE4221385C2 proposed to add a macroscopic permanent magnet near a magnetoresistive layer structure to implement bias by externally adding a permanent magnet. However, the method has the defects of a limited sensor size and complex assembling. Therefore, the externally added permanent magnet is gradually replaced with a permanent magnet film which is deposited near a magnetoresistive film and is isolated from the magnetoresistive film by an insulating film. The method has the defects that a magnetic domain of the permanent magnetic layer is difficult to control and Barkhausen noise will be generated. Another method is to bias by using an exchange coupling function of an anti-ferromagnetic layer, and the method is mentioned in US 20150061658.

In addition, if an AMR sensor is interfered by an external large magnetic field during work, the magnetic domain distribution on AMR strips will be destroyed, such that the magnetic domains on the AMR strips are distributed randomly along some directions. Therefore, the sensitivity of the sensor is reduced, attenuated, or even failed. A common method at present, e.g., US 20130300408A1, is to deposit a set/reset coil on an AMR sensor to achieve the following objectives: the sensor is enabled to work in a high-sensitivity mode; the polarity of an output response cure is reversed; and the linearity is improved to reduce influences of the vertical axis effect and the temperature. However, the method has the defects of increased power consumption and limited maximum measurement magnetic field.

SUMMARY

In order to solve the foregoing problems, the present subject matter provides an AMR sensor without a set and reset device. The sensor includes a substrate, an exchange bias layer, an AMR layer and a collection of barber-pole electrodes. The exchange bias layer is deposited on the substrate, and the AMR layer is deposited on the exchange bias layer. The AMR layer is composed of multiple groups of AMR strips, and the barber-pole electrodes are arranged on each AMR strip under certain rules.

Further, each group of AMR strips is composed of several AMR strips.

Further, the several AMR strips are connected in series to form a group of AMR strips.

Further, the multiple groups of AMR strips are parallel to each other or the multiple groups of AMR strips are arranged in a parallel direction and a perpendicular direction.

Further, the sale included angle is formed between the barber-pole electrodes on the several AMR strips of each group of AMR strips and the respective several AMR strips.

Further, the included angle between the AMR strip and the barber-pole electrode arranged on the AMR strip is ±45°.

Further, the exchange bias layer is made of an anti-ferromagnetic material.

Further, the AMR strips and the barber-pole electrodes arranged on the AMR strips form resistance-sensitive elements, and the resistance-sensitive elements are connected through wires to form a Wheatstone bridge.

Further, the multiple resistance-sensitive elements include two types of resistance-sensitive elements, wherein in one type of resistance-sensitive element, the included angle between the AMR strip and the barber-pole electrode arranged on the AMR strip is 45°, and in the other type of resistance-sensitive element, the included angle between the AMR strip and the barb-pole electrode arranged on the AMR strip is −45°, and the two types of resistance-sensitive elements are closely arranged alternatively.

The AMR sensor without a set and reset device has the following beneficial effects:

1. The present subject matter achieves coupling by using an exchange bias layer, without requiring a reset/set coil. Because a coil is not used, the power consumption of the chip is reduced greatly, and the manufacturing process is simpler, thereby improving the yield of the product and reducing the production costs.

2. The AMR strips are arranged in a parallel direction and a perpendicular direction in the same chip. After magnetic annealing at 45°, the chip can be switched from single-axis operation to double-axes operation, and magnetic fields in multiple directions can be measured at the same time.

3. The design has no gradient effect and the field is measured more accurately.

4. Compared with other designs, the design adopts a resister pair and so on and does not require a resistance adjustment process.

BRIEF DESCRIPTION OF THE DRAWINGS

In order to describe the technical solution in the embodiments of the present subject matter or in the prior art more clearly the accompanying drawings to be used in the descriptions about the embodiments or the prior art are briefly introduced below. Obviously, the accompanying drawings in the following descriptions are only some embodiments of the present subject matter. Those of ordinary skill in the art can also obtain other accompanying drawings according to these accompanying drawings without creative efforts.

Figure 1:
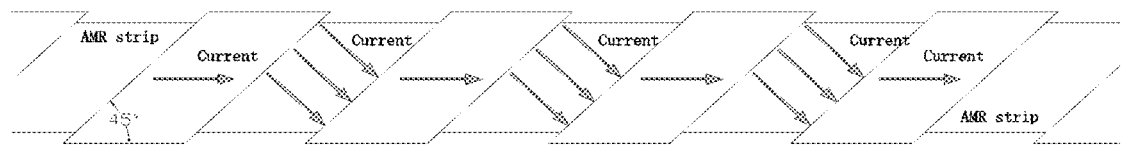
FIG. 1 is a schematic structural diagram of a barber-pole electrode.

In the drawings: 100—AMR sensor without a set and reset device, 101—electrode, 102—electrode, 103—electrode, 104—electrode, 110—AMR layer, 120—wire, 122—barber-pole electrode, 130—exchange bias layer, 140—substrate, 200—AMR sensor chip, 300—AMR sensor chip.

DETAILED DESCRIPTION

The technical solutions in the embodiments of the present subject matter will be described clearly and completely below with reference to the accompanying drawings. Obviously, the described embodiments are merely some rather than all of the embodiments of the present subject matter. All other embodiments obtained by those of ordinary skill in the art without creative efforts based on the embodiments in the present subject matter belong to the scope of protection of the present subject matter.

Figure 2:
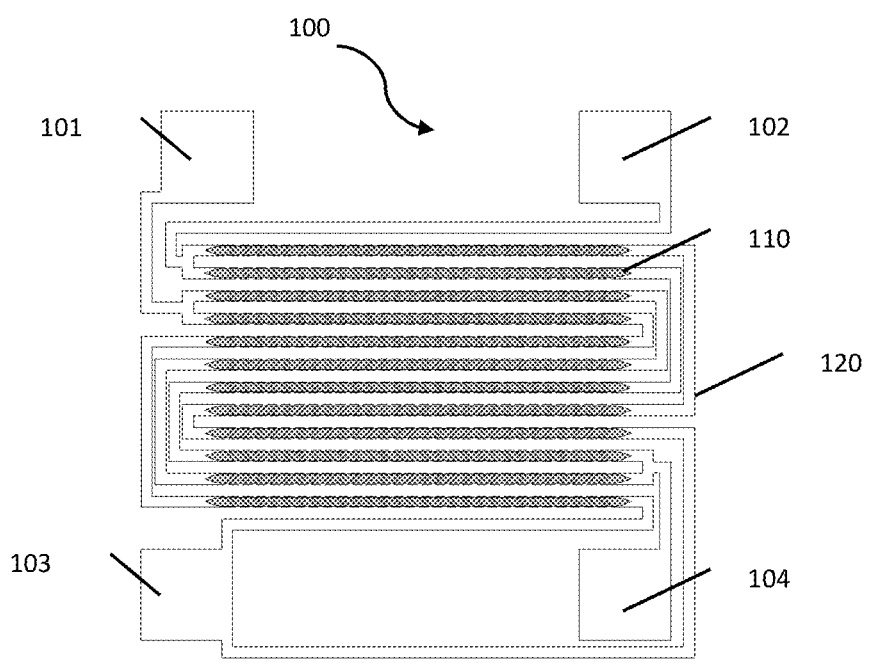
FIG. 2 is a schematic structural diagram of an AMR sensor chip without a set and reset device according to the present subject matter.
Figure 3:
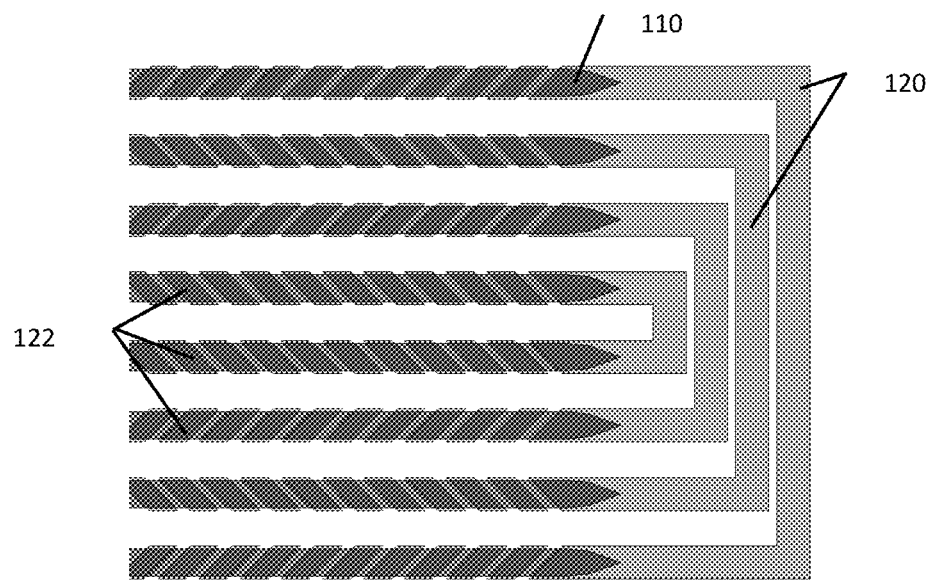
FIG. 3 is a partially enlarged schematic diagram of FIG. 2.
Figure 4:
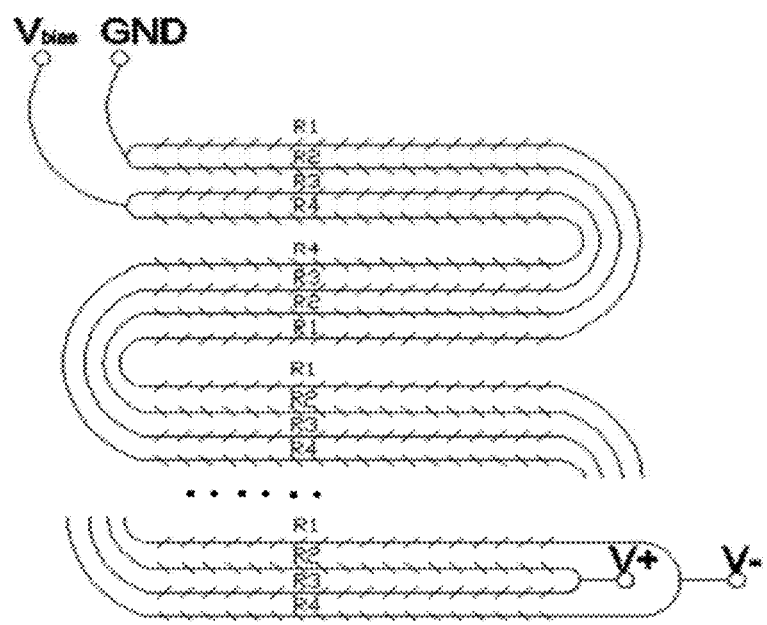
FIG. 4 is a schematic diagram of a connection between AMR strips and barber-pole electrodes.
Figure 5:
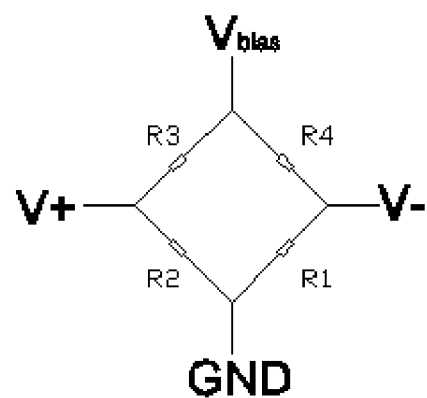
FIG. 5 is a schematic diagram of circuits forming a Wheatstone bridge.

The structure of the sensor 100 of the present subject matter is shown in FIG. 2 and FIG. 3: multiple groups of AMR strips 110 are arranged in an X-axis direction or a Y-axis direction (in the X-axis direction in the drawings). Barber-pole electrodes 122 are arranged on the AMR strips under certain rules. The barber-pole electrode and the AMR strip are generally arranged at an angle of ±45° to forth a resistance-sensitive element. For example, barber-pole electrodes on several AMR strips of R1 and the AMR strips form the same included angle of +45°. The barber-pole electrodes and the AMR strips jointly form the resistance-sensitive elements of the chip. Multiple such resistance-sensitive elements are connected through wires 120 to form a Wheatstone bridge, and the Wheatstone bridge is then connected to 4 electrodes (101, 102, 103, 104) to form the whole chip, thereby finally forming the structure as shown in FIG. 4 and FIG. 5.

Figure 6:
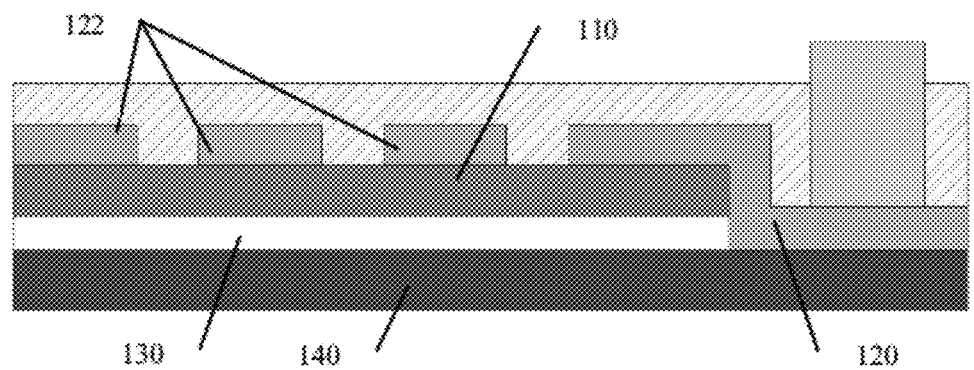
FIG. 6 is a sectional diagram of a chip involved in the present subject matter.

FIG. 6 shows a sectional diagram of a chip involved in the present subject matter. An exchange bias layer 130 is deposited on a substrate 140, and an AMR layer 110 is deposited above the exchange bias layer 130. If a conventional AMR sensor is interfered by an external large magnetic field during work, the magnetic domain distribution in AMR strips will be destroyed, such that the sensitivity of the sensor is attenuated. A current method is to deposit a set/reset coil on the AMR sensor, and when a current passes through the AMR sensor, the magnetic domain directions in the AMR strips are reunified to one direction by using a magnetic field generated by the coil, thereby ensuring the high sensitivity and repeatability of the sensor. In the present subject matter, the exchange bias layer 130 is made of an antiferromagnetic material (PtMn, NiMn, IrMn, etc.). The magnetic moment of the magnetoresistive layer is made firm and stabilized at the original position by using the exchange coupling function between the exchange bias layer 130 and the AMR layer 110. Therefore, the interference from the external magnetic field is avoided, such that the objective of high sensitivity and high repeatability can also be achieved in the present subject matter without a set/reset coil.

Figure 7:
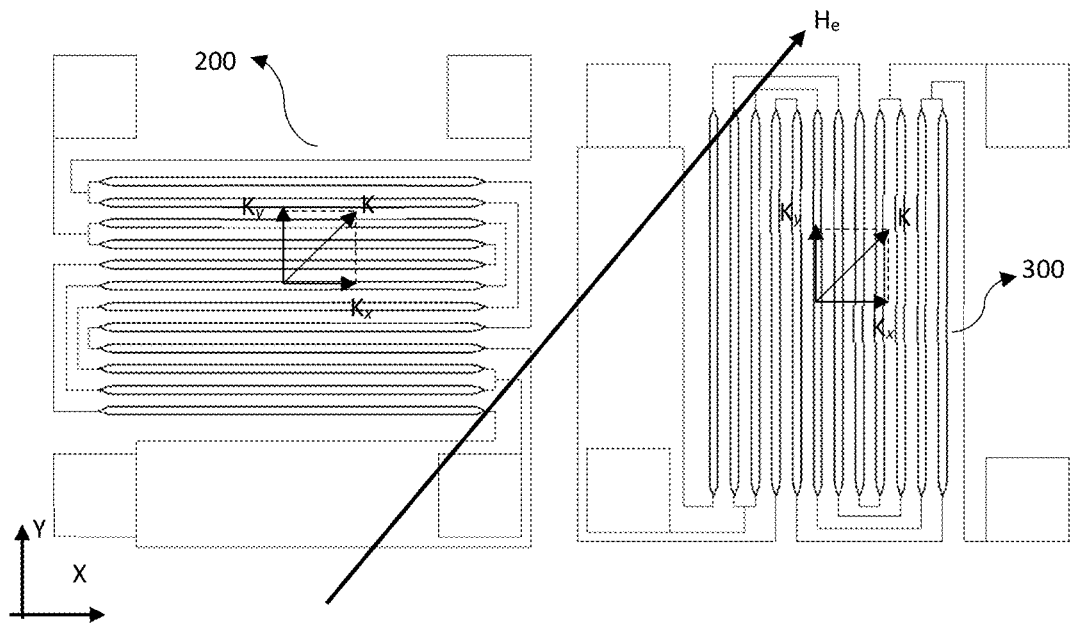
FIG. 7 is a schematic diagram of a magnetic annealing direction and exchange coupling magnetization of AMR strips.

The exchange coupling function involved in the chip is further illustrated below. As shown in FIG. 7, AMR sensor chips 200 and 300 are placed adjacent to each other. The chips use the same design, and the only difference is that long axes of AMR strips in the chip 200 are along the X direction while long axes of AMR strips in the chip 300 are along the Y direction. In order to implement the exchange coupling, it is first required to magnetically anneal the exchange bias layer. An external magnetic field He is applied during annealing, an included angle between the external magnetic field and the X-axis direction being 45°. After the magnetic annealing is finished, there is a magnetization vector K on each strip of the chips 200 and 300 because of the exchange coupling function between the anti-ferromagnetic layer and the magnetoresistive layer. The direction of the magnetization vector K is consistent with the direction of He. Moreover, there are components $K_x$ and $K_y$ in the X-axis direction and the Y-axis direction respectively. As such, through one annealing process, the two chips 200 and 300 with different sensitive directions can implement the measurement functions at the same time, thereby greatly simplifying the production process.

Figure 8:
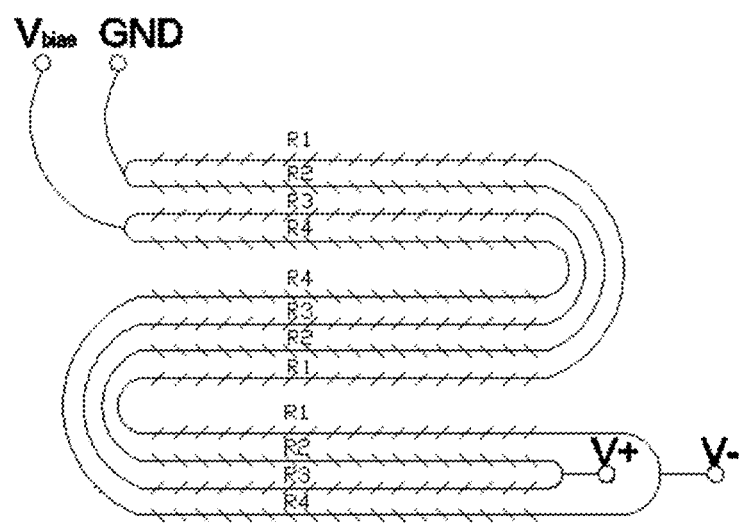
FIG. 8 is an illustration of a design of resister units closely arranged alternately.
Figure 9:
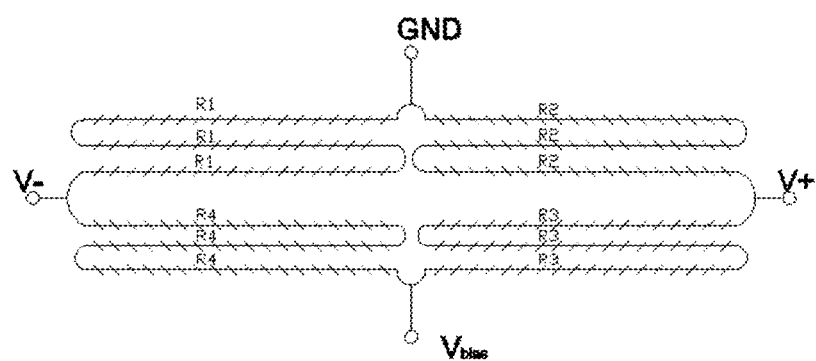
FIG. 9 is an illustration of a design of resister units in a conventional sensor.

In addition, the sensor generally needs multiple resister elements to form a full-bridge or half-bridge structure to work normally. Different magnetoresistive elements in a conventional sensor will be located at different positions. As shown in FIG. 9, there is a position deviation d between resister elements R1 and R2 in the horizontal direction. In this case, if the measured external magnetic field is not uniform and has intensity fluctuations in a tiny distance, there will be a problem of resistance mismatching among R1, R2, R3, and R4. Therefore, output of the sensor is affected, that is, the so-called "gradient effect" is generated. The chip involved in the patent is designed in such a manner that resister units are closely arranged alternately, as shown in FIG. 8, thereby eliminating the position deviation and achieving more accurate field measurement.

Preferred embodiments of the present subject matter are described above. It should be pointed out that for those of ordinary skill in the art, several improvements and modifications can further be made without departing from the principle of the present subject matter. These improvements and modifications are also considered as the protection scope of the present subject matter.

The invention claimed is:

1. An anisotropic magnetoresistive (AMR) sensor without a set and reset device, wherein the sensor comprises:
   a substrate;
   an exchange bias layer;
   an AMR layer; and
   a collection of barber-pole electrodes;
   wherein the exchange bias layer is deposited on the substrate,
   wherein the AMR layer is deposited on the exchange bias layer,
   wherein the AMR layer is composed of multiple groups of AMR strips,
   wherein each group of AMR strips is composed of several AMR strips,
   wherein the barber-pole electrodes are arranged on each AMR strip,
   wherein the AMR strips and the barber-pole electrodes arranged on the AMR strips form resistance-sensitive elements, and the resistance-sensitive elements are connected through wires to form a Wheatstone bridge,
   wherein the resistance-sensitive elements include two types of resistance-sensitive elements, the two types correspond to two different orientations of the barber-pole electrodes to provide two corresponding current directions causing two corresponding resistances for the Wheatstone bridge, and the two types of resistance-sensitive elements are alternately arranged parallel to each other, and
   wherein a first chip includes a first AMR sensor and a second chip includes a second AMR sensor, the exchange bias layer is magnetically annealed to provide each AMR strip in each of the first and second chips with a magnetization vector, and a long axis of AMR strips for the first chip is in a first direction, and a long axis of AMR strips for the second chip is in a second direction perpendicular to the first direction.

2. The AMR sensor without a set and reset device according to claim 1, wherein each group of AMR strips is formed by connecting the several AMR strips in series.

3. The AMR sensor without a set and reset device according to claim 1, wherein the two different orientations include a same first angle formed between each AMR strip in a same first group of AMR strips and the barber-pole electrode and a same second angle formed between each AMR strip in a same second group of AMR strips and the barber-pole electrode.

4. The AMR sensor without a set and reset device according to claim 3, wherein the same first angle and the same second angle include ±45°.

5. The AMR sensor without a set and reset device according to claim 1, wherein the exchange bias layer is made of an anti-ferromagnetic material.

6. The AMR sensor without a set and reset device according to claim 1, wherein in one type of resistance-sensitive element, the included angle between the AMR strip and the barber-pole electrode arranged on the AMR strip is 45°, and in the other type of resistance-sensitive element, the included angle between the AMR strip and the barber-pole electrode arranged on the AMR strip is −45°.

7. A method for forming an anisotropic magnetoresistive (AMR) sensor without a set and reset device, wherein the method comprises:
   depositing an exchange bias layer on a substrate;
   depositing an AMR layer on the exchange bias layer, wherein the AMR layer is composed of multiple groups of AMR strips, and each group of AMR strips is composed of several AMR strips;
   arranging barber-pole electrodes on the AMR layer to form resistance-sensitive elements, wherein the resistance-sensitive elements include two types of resistance-sensitive elements, the two types correspond to two different orientations of the barber-pole electrodes to provide two corresponding current directions causing two corresponding resistances for the Wheatstone bridge, and the two types of resistance-sensitive elements are alternately arranged parallel to each other; and
   connecting the resistance-sensitive elements using wires to form a Wheatstone bridge,
   wherein a first chip includes a first AMR sensor and a second chip includes a second AMR sensor, the method further comprising magnetically annealing the exchange bias layer to provide each AMR strip in each of the first and second chips with a magnetization vector, wherein a long axis of AMR strips for the first chip is in a first direction, and a long axis of AMR strips for the second chip is in a second direction perpendicular to the first direction.

8. The method of claim 7, wherein magnetically annealing includes magnetically annealing the exchange bias layer for each of the first and second chips in one anneal process.

* * * * *